(12) United States Patent
Ackeret et al.

(10) Patent No.: US 6,935,828 B2
(45) Date of Patent: Aug. 30, 2005

(54) WAFER LOAD LOCK AND MAGNETICALLY COUPLED LINEAR DELIVERY SYSTEM

(75) Inventors: Michael A. Ackeret, San Jose, CA (US); Andrew P. Lunday, San Mateo, CA (US)

(73) Assignee: Transfer Engineering and Manufacturing, Inc., Fremont, CA (US)

( * ) Notice: Subject to any disclaimer, the term of this patent is extended or adjusted under 35 U.S.C. 154(b) by 305 days.

(21) Appl. No.: 10/262,263

(22) Filed: Oct. 1, 2002

(65) Prior Publication Data

US 2004/0013501 A1 Jan. 22, 2004

Related U.S. Application Data

(60) Provisional application No. 60/396,451, filed on Jul. 17, 2002.

(51) Int. Cl.[7] .............................................. B65G 35/00
(52) U.S. Cl. ...................... 414/217; 414/939; 198/619
(58) Field of Search ........................... 198/619; 414/217, 414/939

(56) References Cited

U.S. PATENT DOCUMENTS

| 3,202,406 | A | * | 8/1965 | Tack ............................ 432/239 |
| 4,166,563 | A | * | 9/1979 | Peyraud et al. .............. 228/49.5 |
| 4,518,078 | A | * | 5/1985 | Garrett ........................ 198/775 |
| 4,619,573 | A | * | 10/1986 | Rathmann et al. ...... 414/331.14 |
| 4,664,578 | A | * | 5/1987 | Kakehi ........................ 414/217 |
| 5,105,932 | A | | 4/1992 | Bryson, III et al. ......... 198/619 |
| 5,234,303 | A | * | 8/1993 | Koyano ....................... 414/217 |
| 5,288,199 | A | * | 2/1994 | Enomoto .................. 414/749.2 |
| 5,354,380 | A | * | 10/1994 | Zejda ............................ 118/19 |
| 5,377,816 | A | | 1/1995 | Deligi et al. ................. 198/619 |
| 5,417,537 | A | | 5/1995 | Miller .......................... 414/217 |
| 5,881,649 | A | | 3/1999 | Hasegawa et al. ........... 104/167 |
| 5,906,262 | A | | 5/1999 | Miki ....................... 198/341.02 |
| 5,909,995 | A | * | 6/1999 | Wolf et al. ................... 414/217 |
| 5,980,193 | A | * | 11/1999 | Clifton et al. ............ 414/749.2 |
| 6,206,176 | B1 | | 3/2001 | Blonigan et al. ............ 198/619 |
| 6,453,543 | B1 | * | 9/2002 | Tinner et al. .................. 29/607 |
| 6,634,845 | B1 | * | 10/2003 | Komino ....................... 414/217 |
| 2001/0014268 | A1 | | 8/2001 | Bryson et al. ............... 414/217 |
| 2001/0014269 | A1 | | 8/2001 | Hartlage et al. ............. 414/217 |
| 2001/0024609 | A1 | | 9/2001 | White et al. ................. 414/217 |
| 2001/0026748 | A1 | | 10/2001 | Blonigan et al. ............ 414/217 |

* cited by examiner

*Primary Examiner*—Joe Dillon, Jr.
(74) *Attorney, Agent, or Firm*—Charles S. Guenzer

(57) ABSTRACT

A wafer load lock and linear delivery system including within a load lock vacuum chamber a paddle cantilevered from a trolley traveling on a single rail extending on a lateral side of the wafer end of the paddle while it is retracted into the load lock chamber. The trolley is magnetically coupled to an external mechanical, drive through a vacuum wall of the vacuum chamber which drives the wafer on the paddle into an attached processing chamber. A single wafer may be loaded onto the paddle through a door in the vacuum wall. Alternatively, a cassette of wafers may be loaded into a cassette station opposite the processing chamber. One end of the paddle removes a wafer from the cassette, and a hand off station moves the wafer to a second end of the paddle, which then moves it into the processing chamber.

15 Claims, 5 Drawing Sheets

WAFER LOAD LOCK AND MAGNETICALLY COUPLED LINEAR DELIVERY SYSTEM

RELATED APPLICATION

This application claims benefit of U.S. Provisional application Ser. No. 60/396,451 filed Jul. 17, 2002.

BACKGROUND OF THE INVENTION

1. Field of the Invention

The invention relates generally to substrate handling systems. In particular, the invention relates to substrate handling systems involving linear motion from a load lock to a vacuum processing chamber.

2. Background Art

The fabrication of semiconductor integrated circuits is one of several technologies involving the use of vacuum processing chambers for processing wafers or other substrates in a high vacuum, often with noxious gases or with plasmas. Typical chamber pressures for deposition and etching steps range from around a torr for chemical vapor deposition to a millitorr and below for sputtering. Etching pressures typically are intermediate. Establishing very low pressures requires a long pump down from atmospheric pressure and possibly heating of the chamber surfaces to remove adsorbed gases. The pump down problem is exacerbated by the trend toward single-wafer processing reactors in which only a single wafer is processed at a time in the reactor. There are various types of integrated circuits, including both electrical, optical, and opto-electronic circuits and micro electromechanical systems (MEMS), in which a large number of very small devices are formed on a substrate. In most cases, a significant number of identical chips are fabricated on a single wafer or substrate and then separated from each other after fabrication. Particles present a problem for integrated because a single airborne particle deposited on the substrate may ruin an entire integrated circuit chip.

For these and other reasons, both in a production environment and even in research, it has become common practice to maintain the pressure within the processing reactor chamber at a pressure close to the processing pressure even while a substrate is being transferred into or out of the processing reactor chamber. High-volume semiconductor fabrication lines rely largely on platforms or integrated tools having a central transfer chamber arranged around a central axis. Slit valves are formed on the walls of the transfer chamber and selectively separate the transfer chamber from multiple processing chambers and from a load lock through which wafers are loaded into the system from cassettes originally held at atmospheric pressure. Each of the processing chambers and the load lock has its own vacuum pumping system. A robot driven by one or more shafts extending along the central axis and connected to them through magnetic coupling or other types of vacuum feedthroughs controls a wafer paddle through a frog-leg mechanism which can both rotate around the central axis and move into any of the processing chambers or the load lock thereby allowing wafers to be passed through the slit valves between the load lock and the processing chambers. Such a system allows the rapid transfer of wafers between chambers in which processing times for a single step are typically less than a minute.

However, such an integrated tool is not always appropriate. The central transfer chamber is large, and it and the robot are expensive. Many applications, particularly in research and development, do not require the high throughput or multiple processing chambers available in integrated tools but would still benefit from a load lock. Production of some optical circuits and MEMS may require deposition times on the order of hours, and such substrates are often processed in relatively small numbers. Some high-value circuits are manufactured only in relatively small quantities.

Accordingly, several single-wafer load lock and wafer delivery systems have been proposed. For example, a magnetic manipulator described by Bryson et al. in U.S. Pat. No. 5,105,932 and commercially available from Transfer Engineering and Manufacturing, Inc. of Fremont, Calif. may be used with a single-wafer load lock coupled through a slit valve to a single processing reactor. With the slit valve closed, a wafer is manually loaded onto a paddle held by the manipulator in the load lock. Thereafter, the load lock is closed and pumped down, and the slit valve is opened. The manipulator includes a rod which holds the paddle on its end and which is magnetically coupled to a control lever on the outside so that the lever can move the paddle and its wafer from the load lock into the processing chamber. A lift pin assembly in the processing chamber removes the wafer from the paddle, which is then withdrawn, and the slit valve is closed for wafer processing.

This arrangement is reliable, rugged, not prone to generate particles, and relatively inexpensive. However, the arrangement requires a relatively long arm extending from the load lock chamber on its side opposite the processing chamber. The rod has a length including the distance between the wafer positions in the load lock and processing chambers, the wafer diameter, and the required length of the magnetic coupling and lever. Further, the relatively long rod protrudes into the clean room from which the wafers are loaded. Clean room space of the quality required for integrated circuit fabrication is extremely expensive to build and maintain. Therefore a need exists for a load lock and wafer delivery system that is relatively small, that is, has a small footprint especially within the clean room.

Bryson et al. in U.S. Published Patent Application 2001/0041268 A1 describes one type of single-wafer load lock involving a two-stage extendible two-track carriage. However, this approach has not gained commercial success because of its complexity and perceived deficiencies.

SUMMARY OF THE INVENTION

A substrate load lock and delivery system may be used to transfer a substrate, such as a semiconductor wafer, from ambient into a processing chamber which is always kept at reduced pressure and is separated from the load lock by a gate valve, which when open permits the passage of the substrate and a paddle bearing it. The paddle is cantilevered from a trolley sliding on a fixed rail within the load lock chamber, preferably a single trolley on a single rail. The trolley is magnetically coupled through a wall of the load lock chamber to a linear drive on the outside of the chamber that extends in parallel to and at least partially to the side of the path along which the substrate travels while borne on the paddle. For example, drive may be a lead screw extending along the bottom or the side of the load lock chamber and linearly transporting a magnet magnetized along the direction of the rail but in an opposite direction from that of a magnet on the trolley.

The trolley may include a plurality of ball or roller bearings on each of its axial ends rollingly engaging all four sides of the rail. Preferably, the rail and the rim of the bearings are made of materials of equal hardness, for example, all from a hardened stainless steel.

The rail and the paddle may be separated by a wall having a slot accommodating a support carried on the trolley and fixed to the paddle away from its substrate bearing end.

The magnetic coupling may include two magnets disposed on opposite sides of a generally semi-circularly shaped vacuum wall. The magnets both have semi-circular arc shapes and are magnetized in opposite directions along an axis of the vacuum wall.

For a single substrate load lock, the substrate may be loaded onto the processing end of the paddle through a vacuum door on the top of the load lock chamber.

In a cassette load lock, the cassette may be located on an opposite side of the paddle from the processing chamber. A cassette end of the paddle is inserted into a shelf of the cassette that has been raised to a plane of the paddle. The paddle removes the substrate from the cassette and moves it out of the cassette to a substrate hand off station, which raises the substrate off the paddle. The paddle is reversed until a processing end of the paddle underlies the raised substrate, which is then lowered onto the processing end of the paddle. The paddle then moves the wafer into the processing chamber.

DETAILED DESCRIPTION OF THE PREFERRED EMBODIMENTS

Figure 1:
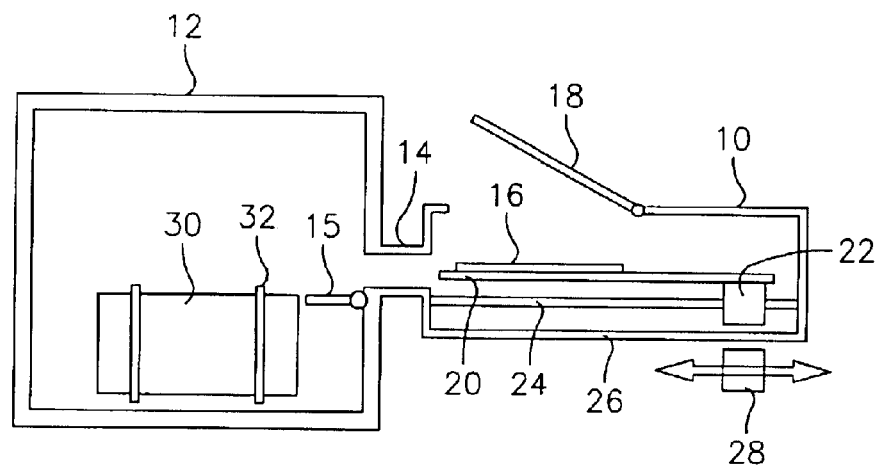
FIG. 1 is a schematic cross-sectional view of one embodiment of a load lock and linear delivery system in use with a processing reactor.

A schematic cross-sectional representation of an embodiment of a wafer load lock and linear delivery system is illustrated in FIG. 1. A load lock 10 is connected to a vacuum processing chamber 12 through a loading port 14 having a slit valve (or other type of gate valve) 15, which unlike the illustrated pivoted door 15, is typically pneumatically actuated along a linear path from either the interior or the exterior of the vacuum chamber 12 to engage an inclined surface with an O-ring surrounding the port 14. The selectively openable slit valve 15 enables selectively transferring a wafer 16 between the load lock 10 and the processing chamber 12 or alternatively vacuum isolating the processing chamber 12 from the load lock 10 both while the wafer 16 is being transferred between the load lock 10 and the ambient exterior and while the wafer 16 is being processed in the processing chamber 12. The load lock 10 and the processing chamber 12 have separate unillustrated vacuum pumping systems connected to them through respective pumping ports. Once the system has been started, the pressure in the processing chamber 12 is kept below a minimum vacuum (maximum pressure) typically associated with wafer transfer so that it is isolated from ambient particles and can be more quickly pumped down to a very low processing pressure. On the other hand, the load lock 10 in the illustrated configuration is repetitively cycled between atmospheric pressure and the transfer pressure during sequential processing of multiple wafers.

The wafer 16 is inserted into the system by closing the slit valve 15 and raising the load lock pressure to near atmospheric. A vacuum door 18 on top of the load lock 10 is opened, and the wafer 16 is manually loaded onto the distal end of a paddle 20 (alternatively called an end effector) facing the loading port 14 and the processing chamber 12. A trolley 22 supports the proximal end of the paddle 20 is supported by a trolley 22 so that the wafer-bearing distal end of the paddle 20 is cantilevered from it. A rail 24 positioned within the load lock 10 below the paddle 20 supports and guides the trolley 22 allowing it to slide on the rail 24. Although more complex shapes can be envisaged, a rail having a rectangular cross section has proved satisfactory. A 10 cm long trolley 22 has been found to provide sufficient rigidity to the paddle 20 for wafer positioning at the various transfer positions. The trolley 22 is magnetically coupled across a bottom wall 26 of the load lock 10 to a driver 28 that is manually or automatically moved parallel to the rail 24.

Once the wafer 16 has been transferred to the paddle 16 located in the illustrated position and the load lock 10 has been pumped down to the desired transfer pressure, the slit valve 15 in the loading port 14 is opened. The loading port 14 is sized to allow the distal end of the paddle 20 and the wafer 16 it supports to pass through the port 14 and the opened slit valve 15. The driver 28 is moved toward the processing chamber 12 so that the wafer 16 passes through the slit valve 15 and is placed over a processing pedestal 30 having raisable lift pins 32 passing through it. The lift pins 32 lift the wafer 16 from the paddle 20, the driver 28 is moved away from the processing chamber 12 to withdraw the empty paddle 20 from the processing chamber 12, and the lift pins lower the wafer 16 onto the pedestal 30. The slit valve 15 is then closed to isolate the processing chamber 12 from the load lock 10, and the processing chamber 12 is controlled to perform predetermined processing on the wafer, possibly including further reduction in pressure, introduction of reactive processing gases, or the generation of plasma.

Once the processing of one wafer has been completed, the above described transfer procedure is performed in reverse so that the wafer 16 is reloaded onto the paddle 20, and the driver 28 withdraws the wafer 16 from the processing chamber 12 to the illustrated position within the load lock 10. The load lock pressure is raised to near atmospheric, and the vacuum door 18 is opened allowing manual removal of the processed wafer 16 and its replacement on the paddle 20 by an unprocessed wafer before the cycle described above is repeated.

In some applications, it may be useful to couple the load lock 10 to a central transfer chamber around which are arranged multiple processing chambers, each of which may be separated from the central transfer chamber by a respective slit valve. The paddle 20 transfer a wafer into the central transfer chamber, and rotary robot within the central transfer chamber directly or indirectly receives the wafer from the paddle 20 and then transfers the wafer between the multiple processing chambers.

This design offers several benefits. The footprint of the load lock and its manipulator is greatly decreased over that resulting when the manipulator is a rod supporting the proximal end of the paddle and projected therefrom away from the processing chamber. In that case, the rod must extend to the right as illustrated the entire throw distance of the paddle travel, and this distance is within the clean room from which the wafers are being transferred. In the inventive design, the throw distance may extend from one end of the load lock 10 to the other including the wafer-loading area less the axial extent of trolley 22. Furthermore, whatever particles are generated by the trolley 22 traveling along the rail 24 are generated below the wafer and are thus more likely to fall to the bottom of the load lock rather than settle on the wafer. Yet further, the design is simpler than the two-dimensional robot and hence more economical. Even the simple one-rail design provides adequate stability and repeatable wafer positioning.

Figure 2:
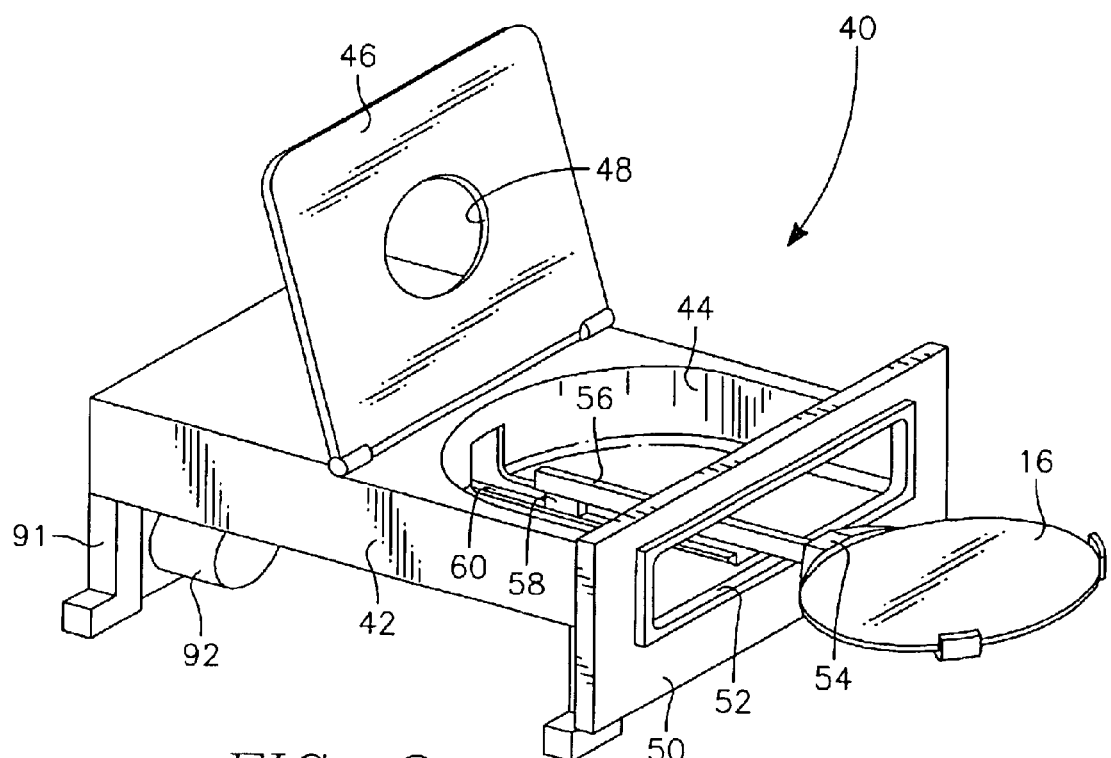
FIG. 2 is a detailed orthographic view of system of FIG. 1.

A more detailed orthographic view of a load lock and linear delivery system 40 is illustrated in FIG. 2. A load lock chamber 42 includes an opening 44 on its top surrounded by an O-ring against which a hinged door 46 with an inspection window 48 vacuum seals the interior of the chamber. The load lock chamber 42 is sealed to an interface plate 50, which has a rectangular opening 52 with a surrounding O-ring which is fixed to and vacuum sealed to a processing reactor in conformance to industry standards for such an interface. The wafer 16 is supported on a paddle assembly including a wafer holder 54 and an paddle arm 56. A riser 58, which supports the end of the paddle arm 56 away from the wafer hold 52, penetrates the interior of the wafer area of the load lock chamber 42 through a slot 60 in the bottom of the load lock chamber 42 linearly extending from near the interface plate 50 to an area in back of the wafer volume. Thereby, when the riser 58 is moved from its rearmost position, at which the wafer holder 54 is disposed beneath the closed door 46, forward towards the interface plate 50, the wafer 16 is moved from the wafer volume through the aperture 52 of the interface plate 50 and into the processing reactor. The slot 60 substantially isolates the upper, wafer portion of the load lock from the lower, mechanical portion where particles are being potentially generated.

Figure 3:
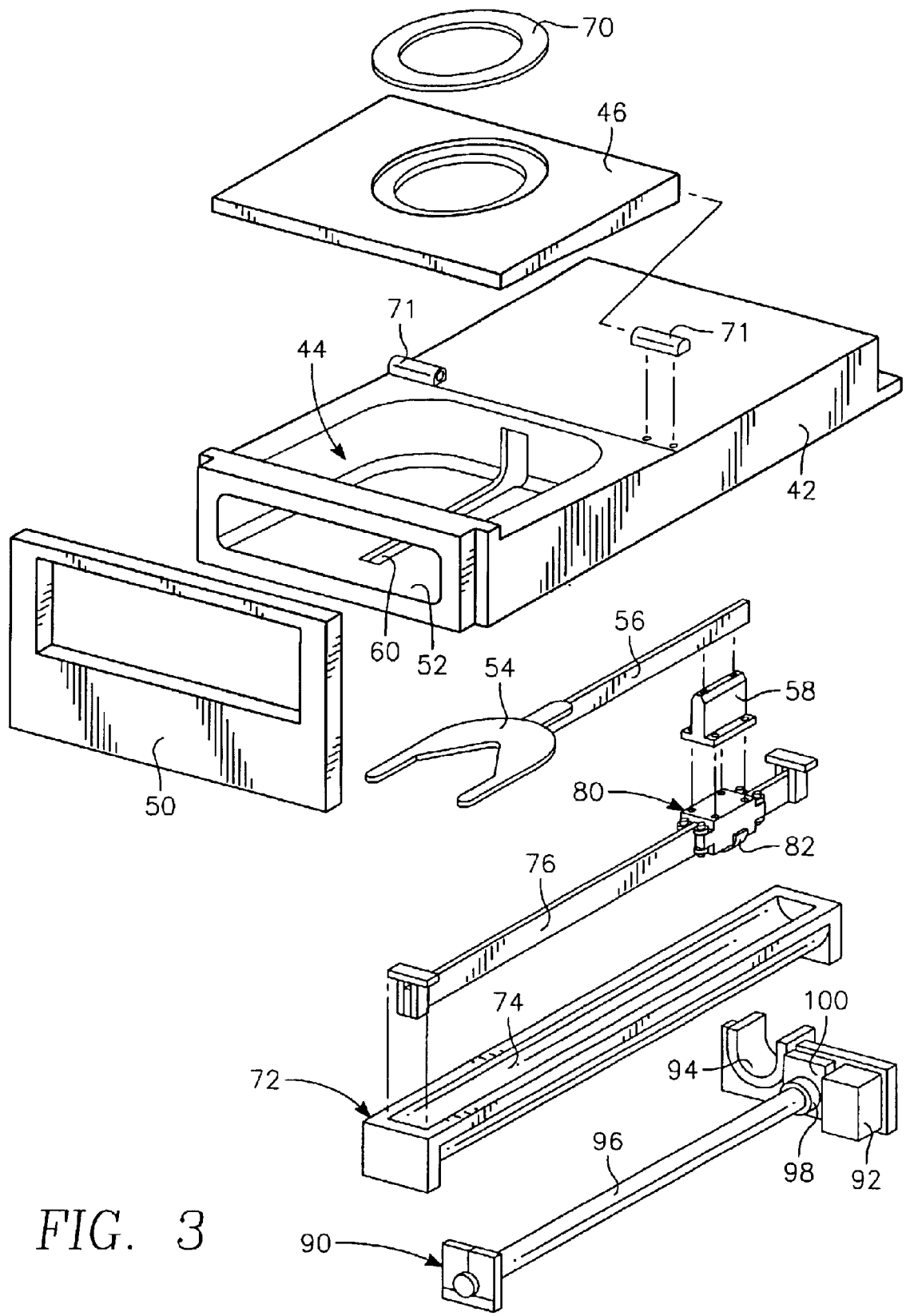
FIG. 3 is an exploded orthographic view of a variant of the system of FIG. 2.

An exploded orthographic view of a somewhat modified version of the of the load lock and linear delivery system 40 is illustrated in FIG. 3. An annular flange 70 vacuum seals an unillustrated window to the top of the door 46. Two hinges 71 fixed to both the rear of the door 46 and the top of the load lock chamber 42 allows the door 46 to swing between the open position which allows a wafer to be transferred in and out of the load lock and a closed position which vacuum seals the door 46 to the chamber 42.

The riser 58 has an upper portion which fits through the slot 60 in the bottom of the load lock chamber 42 to support the paddle assembly including the wafer holder 54 and paddle arm 56 within the upper portion of the load lock chamber 42. A non-magnetic nacelle cover 72 having a semicircular lower outer surface 74 is fixed and vacuum sealed to the bottom of the load lock chamber 42. The nacelle cover 72 supports a rail assembly including a rail 76 linearly extending along and beneath the chamber slot 60. A trolley 80 is supported on and freely slides along the rail 76. The riser 58 is fixed to the top of the trolley 80 so that the paddle assembly moves with the trolley 80. A first saddle magnet 82 is fit to the bottom of the trolley 80. It is magnetized along the axis of the rail 76 and has a general horseshoe shape with an outer radius to slidably fit near the inner side of the semi-circular surface 74 of the nacelle cover 72. The trolley 80 and first magnet 82 act as an internal drive while the rail 74 acts as an internal guide.

An outer drive assembly 90 is positioned and mounted outside the vacuum chamber, preferably with legs 91 (FIG. 2) supporting the load lock chamber 42. The outer drive assembly 90 includes a lead screw assembly driven by a motor 92 that drives a second saddle magnet 94 in the axial direction on the outside of the semicircular surface 74 of the nacelle cover 72. The lead drive assembly includes a lead screw enclosed within a tubular cover 96 having an axial key slot. A lead nut 98 is fixed to a key fitted within the key slot of the cover 96 and having with a threaded inner side engaged with the lead screw. A magnet mount 100 is fixed to the lead nut 98 and supports the second saddle magnet 94 adjacent the outer semicircular surface 94 of the nacelle cover 96. The motor 92, lead nut 98, lead screw, and second magnet 94 act as the external drive while the slotted tubular cover 96 acts as the external guide. Other types of external mechanical drives are possible, such as a rack and pinion or a pneumatic cylinder.

The second saddle magnet 94 is also magnetized along the axis of the rail 74 but in the opposite direction than the first saddle magnet 82. Both magnets 82, 94 are composed of rare-earth magnetic material, such as NdBFe, and form a powerful magnetic circuit across the non-magnetic nacelle cover 74. Thereby, the motor 92 on the exterior of the load lock vacuum chamber linearly drives the trolley 80 and attached wafer paddle assembly within the vacuum chamber.

Figure 4:
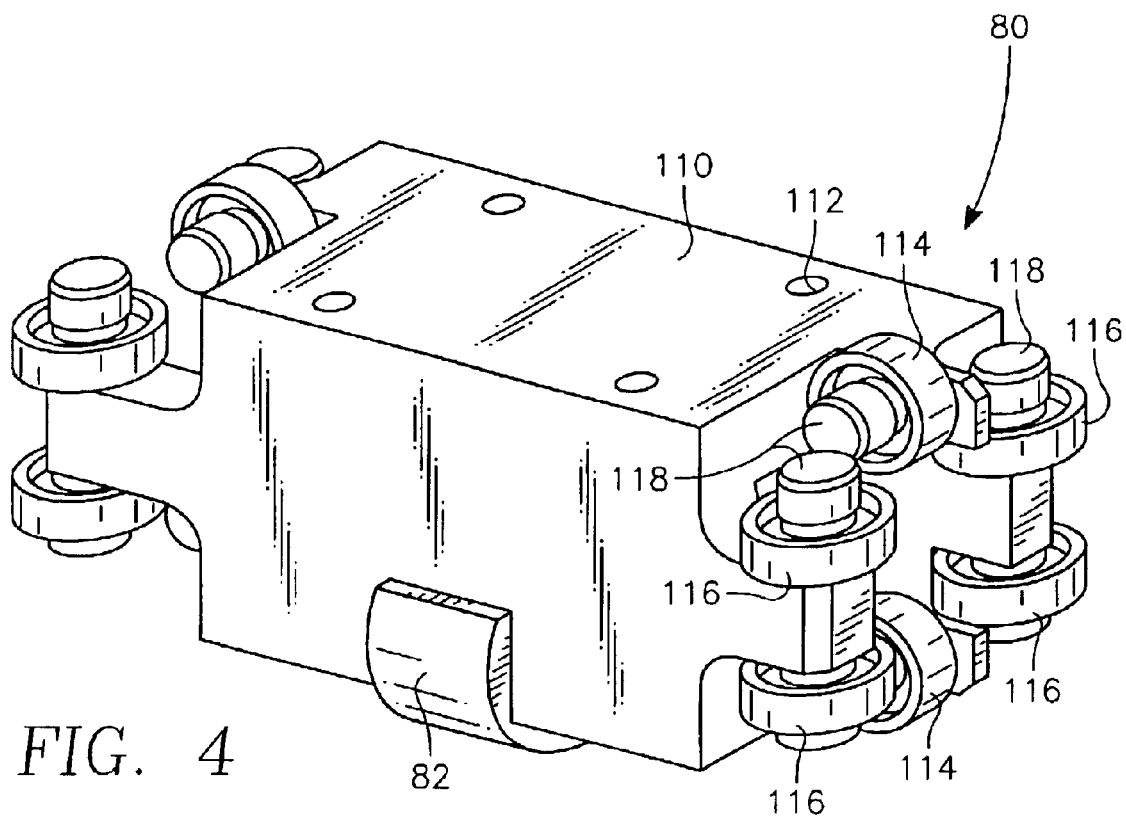
FIG. 4 is an orthographic view of a trolley usable with the invention.
Figure 5:
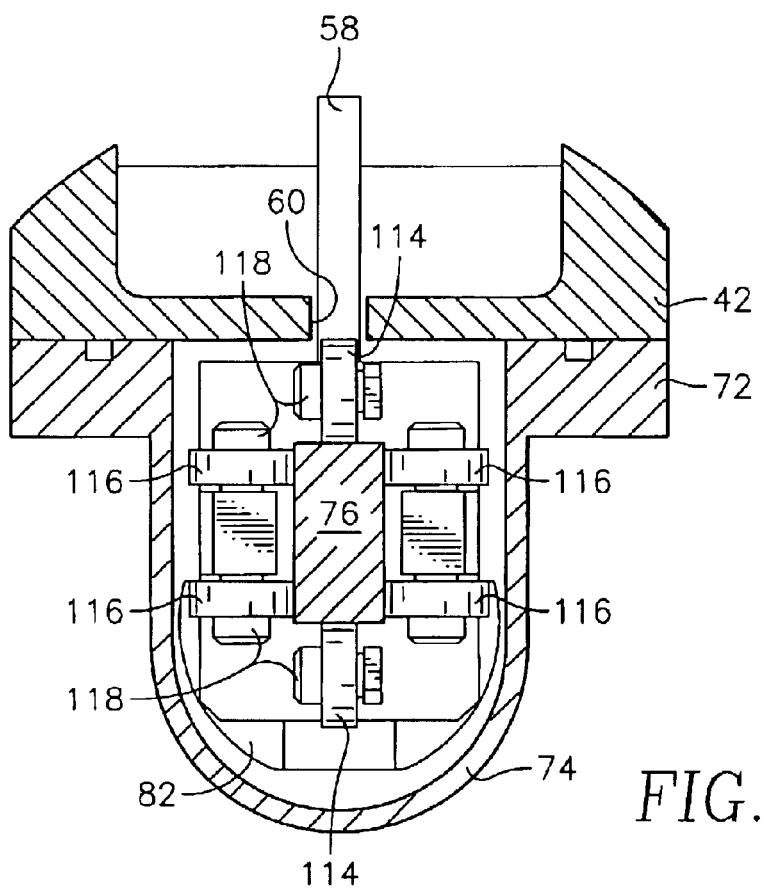
FIG. 5 is an axial cross-sectional view of the trolley of FIG. 4 and associated parts.

The trolley 80 is illustrated orthographically in FIG. 4 and in axial cross-sectional view in FIG. 5 together with some of the associated parts. A trolley body 110 includes screw holes 112 on its upper side to mount a flange attached to the bottom of the riser 58. The first saddle magnet 82 is mounted to the bottom of the trolley body 110. Six ball bearing assemblies, although four may suffice, are mounted on each of the two axial ends of the trolley body 110. On each end, two outer bearing races 114 with generally cylindrical outer surfaces roll on the top and bottom sides of the rail 76 while four orthogonal outer bearing races 116 roll on the upper and lower portions of the two lateral sides of the rail 76. Respective shoulder screws 118 fix the inner bearing races or hubs of the ball bearing assemblies to the trolley body 110, and ball bearings are fit in raceways between the inner bearing races and the outer bearing races 114, 116 and confined there by retainers. Tightening and adjustment means, such as slots within the trolley body 110 and tightening screws, should be included within the trolley 80 to allow the twelve ball bearing assemblies to firmly but not excessively engage the sides of the rails. Roller bearings are possibly used but are considered unnecessarily complex.

The rolling engagement between the bearings and the rail provide the only sliding contact of parts within the vacuum chamber. It has been found that production of particles is reduced if the rail and bearing rims are composed of the same material, preferably a hardened and polished stainless steel, such as SS 440C. Further, smooth mechanical movement is improved by the use of like, hard materials.

The above described single-wafer load lock and delivery system is both convenient and economical for a research or other environment requiring the processing of a very limited number of wafers. However, there are other environments, such as advanced development requiring generation of statistically significant data on a reasonable number of wafers or in small-scale production of a small but significant number of wafers or other substrates, in which the manual loading and unloading of wafers from the single-wafer load lock becomes inconvenient and prevents automated processing in the absence of an operator. In these situations, it would be convenient to simultaneously load multiple wafers into the processing system before pump down from atmospheric pressure and thereafter to sequentially and automatically process the wafers.

Figure 6:
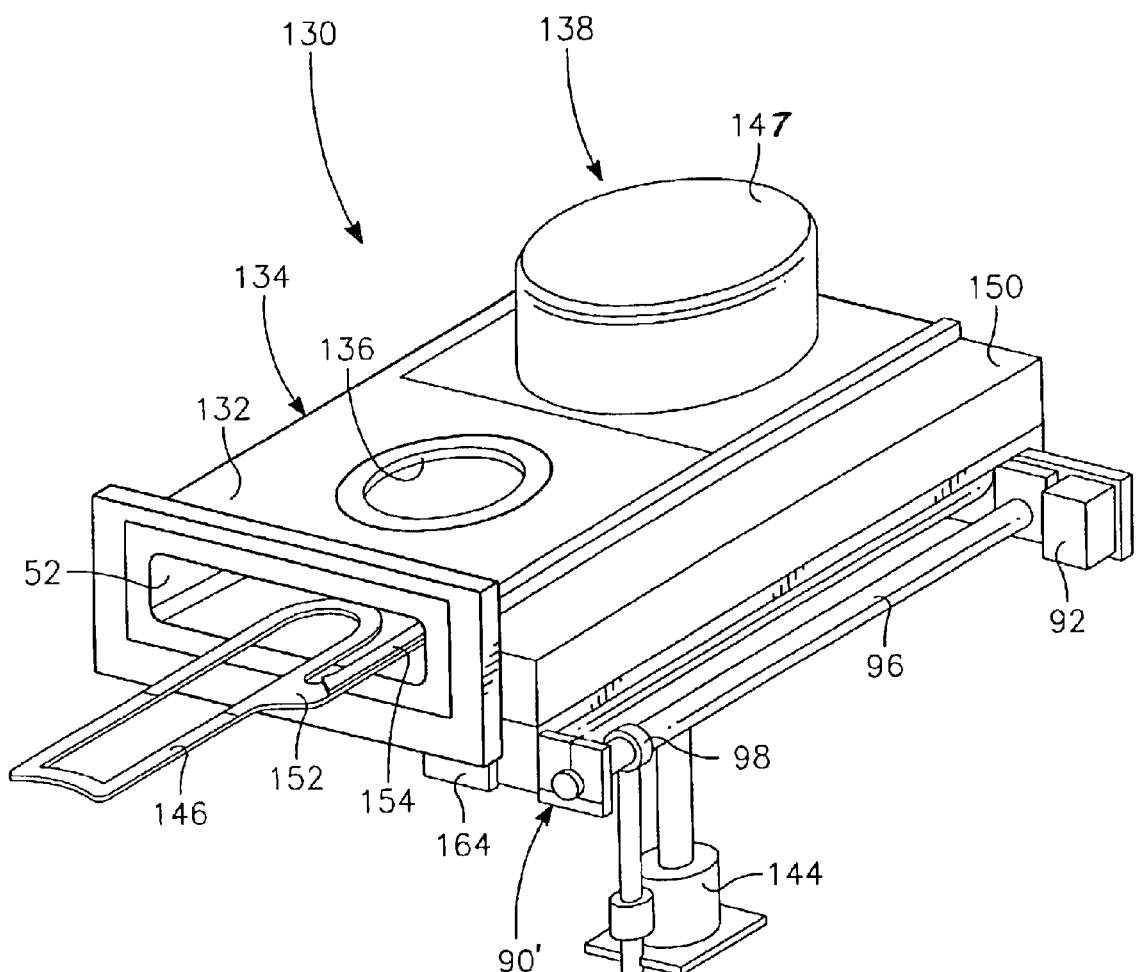
FIG. 6 is an orthographic view of a embodiment of a load lock and linear delivery system of the invention usable with a wafer cassette.
Figure 7:
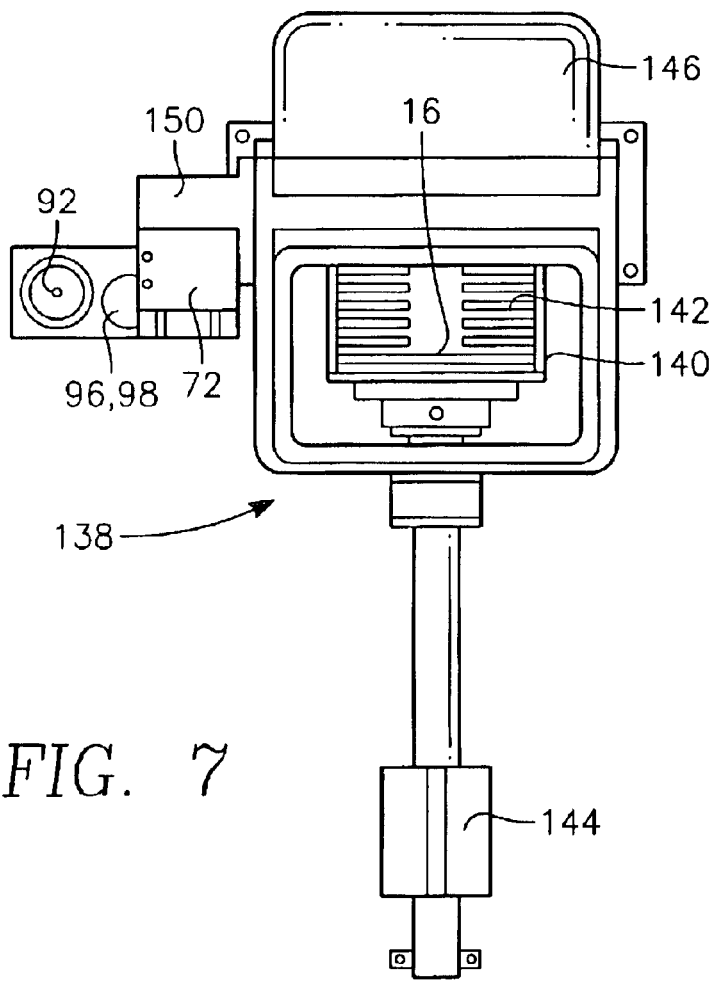
FIG. 7 is an end elevational view of the system of FIG. 6.

A cassette load lock and delivery system 130, illustrated orthographically in FIG. 6 includes a load lock chamber 132 in which a handoff station 134 disposed beneath a chamber inspection window 136 is interposed between the loading port 52 to the processing chamber and a cassette station 138. In this embodiment, there is no gate valve between the cassette station 138 and the handoff station 134. As illustrated in the end elevation of FIG. 7, the cassette station 138 includes a cassette 140, viewed through a removed vacuum loading door, including a plurality, preferably ten or more, of wafer shelves 142. The wafers may be manually or automatically loaded and unloaded through the opened door onto and from the cassette shelves 142. Alternatively and preferably, the wafers are transferred to and from the cassette shelves 142 while the cassette 140 is removed through the open door to the exterior of the cassette station 138. During the loading of the wafers into the cassette station 138, the cassette station 138 is vertically positioned below a wafer paddle 146, also illustrated in top plan view in FIG. 8. Once the wafers are loaded, the vacuum door on the end is closed, the load lock chamber 132 including the cassette station 138 and the handoff station 134 is pumped down to transfer pressure.

An automated motor-driver elevator mechanism 144 can raise and lower the cassette 140 between a lowest position somewhat lower than that illustrated and an uppermost position when part of the cassette 140 is within a dome 147 as well as to intermediate positions where the paddle 146 can access the wafer supported on any of the shelves 142. After the wafers are loaded into the cassette 140, the paddle 146 is moved away from the cassette station 138, and the elevator mechanism 144 then raises the cassette 140 so that the selected shelf 142 is positioned approximately in the plane of the paddle 146.

The illustrated cassette 140 is advantageously removable from the cassette station for loading and unloading of wafers. Thereafter, the cassette 140 with fresh wafers is reinserted into the cassette station and positioned therein by pin. The invention is easily extended to environmentally isolated cassettes, such as SMIF or FOUP boxes, that are pre-loaded with wafers and then inserted onto an elevator floor within the cassette station 138. In any case, the end location of the loading door means that only the loading door need protrude into the valuable clean room space. The remainder of the system including the processing reactor are advantageously positioned in the dirtier and less expensive chase in back of the walls of the clean room.

The drive for the paddle 146 is similar to that illustrated in FIG. 3. However, to avoid interfering with the cassette 140 and the elevator mechanism 144, the drive is mounted on the side, as best shown in FIG. 6. A side extension 150 to the hand off station 134 encloses the rail 76 and the trolley 80 of FIG. 3, and the trolley 74 is magnetically coupled to an external drive mechanism 90' through the nacelle cover 72 at the bottom of the extension 150. The paddle 146 includes a slanting side arm 152. A support arm 154 extending partially downward connects the paddle side arm 152 to the trolley riser 58. The directions of the two arms 152, 154 put the drive elements out of the plane of the paddle 146 to facilitate inspection.

The single paddle 146 is used to access both the cassette 140 and the processing chamber while moving in a linear path. To accomplish this, the paddle 146 has different support areas at its two ends, and the wafer is transferred from one end of the paddle 146 to the other at the hand off station 134. During loading of the cassette 140 or its wafers, the paddle is fully retracted into the hand off station 134 so that it extends into the cassette station 138. However, the cassette 140 is lowered so that it is below the fully retracted paddle 146. The slit valve 15 to the processing chamber is then closed to isolate it from the cassette station 138 when the cassette station end loading door is opened. After the cassette 140 has been loaded, the cassette station door is closed and the cassette station 138 is pumped down. Then, the slit valve 15 to the processing reactor is opened to expose the processing chamber to the cassette station 138, thus allowing the paddle to traverse between the two.

The elevator mechanism 144 is then raised or lowered to present a selected shelf 142 to the paddle 146. The vertical cassette position must be somewhat high for a selected shelf 142 so that the paddle 146 can be slid beneath the wafer 16 supported on the selected shelf 142. The elevator mechanism 144 then slightly lowers the cassette 140 so that the wafer 16 is lowered onto and is supported by tapered support pins 160, in this embodiment numbering three, on the cassette end of the paddle 146.

The drive mechanism then moves the paddle 146 towards the processing chamber until the supported wafer 16 overlies a raisable hand off platform 162 in the hand off station 134. The hand off platform 162 is vertically moved by an automated, motor-driven manipulator 164 penetrating the bottom of load lock chamber 134 through an appropriate feedthrough or magnetic coupling. With the wafer 16 supported on the paddle 146 above it, the hand off platform 162 is raised until three Vespel pads 166 mounted on its top raise the wafer 16 off the paddle 146. The paddle 146 is formed with a racetrack shaped aperture 168 to allow the platform 162 to be raised from the bottom of the paddle 146 through the aperture 168 and lift the wafer 16 from the top of the paddle 146.

Figure 8:
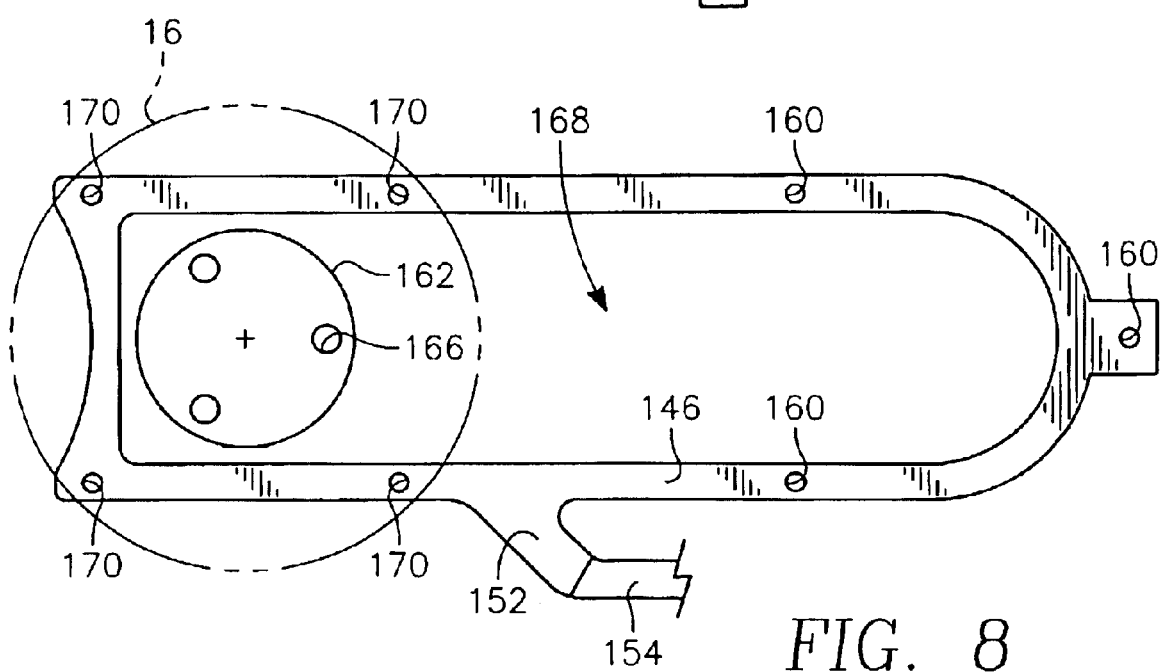
FIG. 8 is a plan view of a wafer paddle usable with the system of FIGS. 6 and 7.

The platform 162 remains raised with the wafer 16 supported on it while the drive mechanism withdraws the empty paddle 146 towards the cassette station 138 until the supported wafer 16 overlies the processing end of the paddle 146, as illustrated in FIG. 8. The platform 162 is then lowered to place the wafer 16 upon four pins 170 on the upper side of the processing end of the paddle 146. With the completion of the wafer hand off and with the platform 162 lowered completely out of the way, the drive mechanism moves the paddle 146 and the wafer 16 supported on its processing end into the processing chamber. Lift pins within the processing chamber lift the wafer 16 from the paddle 146, the paddle 146 is withdrawn, and the slit valve 15 between the processing chamber and the load lock chamber 134 is closed to allow vacuum processing of the wafer 16. After the wafer processing, the above described procedure is reversed so the wafer 16 is placed back on the same or a different shelf 142. The paddle 146 is then withdrawn from the cassette 140 to allow the elevator mechanism 144 to present a different shelf 142 to the paddle 146. Multiple wafers 16 in the cassette 140 may thus be sequentially processed with a single pump down of the load lock including the cassette and hand off stations.

As is apparent from FIG. 8, the shapes of the two ends of the paddle 146 and the number and distribution of the support pins may be different and tailored to the respective requirements of the cassette and the processing chamber. Although the travel of the paddle 146 during the wafer hand off is limited by the linear extent of the paddle aperture 168, during wafer transfer into and out of the cassette station 138 and into and out of the processing chamber, the travel is not so limited and the solid parts of the paddle 146 may pass over the depressed handoff platform 162.

It is possible to provide a modular system including wafer hand off in which the wafer loading is performed in a replaceable station which can be either a single-wafer station in which a wafer is manually loaded onto the cassette end of the paddle but there is no cassette or an automatic cassette station as described. Thereby, a system can be upgraded to cassette loading as the need arises.

The stability and rigidity of the transfer mechanisms could be improved by using two rails or tracks, preferably symmetrically positioned on either side of the paddle center line. However, the described one-rail designs are more economical and have been shown to provide adequate performance when used for lightweight silicon wafers.

The invention thus provides an economical system having a small footprint but nonetheless generating few particles.

What is claimed is:

1. A substrate load lock and delivery system affixable to a processing chamber for processing substrates, comprising:
   a vacuum load lock chamber connectable to said processing chamber through a loading port;
   a rail within said load lock chamber having four rectangularly arranged lateral sides and extending in an axial direction towards said loading port but vertically below said loading port;
   a trolley sliding on said rail, wherein said trolley includes two pairs each comprising at least four bearings and being disposed opposite axial ends of said trolley, said four bearings of each pair engaging respective ones of said four lateral sides of said rail
   a first magnet assembly carried on said trolley; and
   a second magnet assembly disposed on an opposite side of a vacuum wall of said vacuum load lock chamber from said first magnet assembly and magnetically coupled to said first magnet assembly and adapted to deliver a substrate between said load lock chamber and said processing chamber.

2. The system of claim 1, further comprising an external mechanical drive located exterior to said vacuum chamber and moving said second magnet assembly parallel in said axial direction.

3. The system of claim 1, wherein said first and second magnet assemblies are magnetized in anti-parallel directions along said axial direction.

4. The system of claim 1, further comprising an openable vacuum door disposed a top of said vacuum load lock chamber sized to pass therethrough a substrate to and from said first substrate bearing surface.

5. The system of claim 1, wherein said bearings include respective ball bearings and rolling members including inner races accommodating said ball bearings and outer cylindrical rolling surfaces.

6. A substrate load lock and delivery system affixable to a processing chamber for processing substrates, comprising:
   a vacuum load lock chamber connectable to said processing chamber through a loading port;
   a rail within said load lock chamber extending in an axial direction towards said loading port but vertically below said loading port;
   a trolley sliding on said rail, wherein said trolley includes a plurality of rolling bearings engaging said rail and wherein races of said bearings engaging said rail and said rail are made of materials of equal hardness;
   a substrate paddle having a first substrate bearing surface and supported on said trolley with said first substrate bearing surface cantilevered from said trolley in said axial direction toward said loading port, wherein during an operation of said system said paddle is disposed at least partially beyond an axial end of said rail in a direction of said loading port from said load lock chamber;
   a first magnet assembly carried on said trolley; and
   a second magnet assembly disposed on an opposite side of a vacuum wall of said vacuum load lock chamber from said first magnet assembly and magnetically coupled to said first magnet assembly and adapted to deliver a substrate between said load lock chamber and said processing chamber.

7. The system of claim 6, wherein said races and said rail comprise a same type of stainless steel.

8. The system of claim 6, wherein said bearings include respective ball bearings and rolling members including inner races accommodating said ball bearings and outer cylindrical rolling surfaces.

9. A substrate load lock and delivery system affixable to a processing chamber for processing substrates, comprising:
   a vacuum load lock chamber connectable to said processing chamber through a loading port;
   a rail within said load lock chamber extending in an axial direction towards said loading port;
   a trolley sliding on said rail;
   a substrate paddle having a substrate bearing surface and supported on and above said trolley with said substrate bearing surface cantilevered from said trolley in said axial direction toward said loading port;
   a wall disposed in said load lock chamber between said rail and said paddle and having a slot extending along said axial direction;
   a riser supporting said paddle above said wall, supported on said trolley beneath said wall, and extending through and movable along said slot;
   a first magnet assembly carried on said trolley; and
   a drive mechanism positioned outside a vacuum wall of said vacuum load lock chamber and moving a second magnet assembly along said axial direction which is magnetically couplable across said vacuum wall to said first magnet assembly to drive said trolley along said rail.

10. The system of claim 9, wherein said vacuum wall includes a semi-circular wall portion extending along said axial direction.

11. The system of claim 9, wherein said trolley includes a pair of at least four ball bearings disposed on axially opposed ends of said trolley and respectively rollingly engaging four sides of said rail.

12. A substrate load lock and delivery system affixable to a processing chamber for processing substrates, comprising:
   a vacuum load lock chamber having an interior connectable to said processing chamber through a loading port;
   a rail within said load lock chamber extending in an axial direction towards said loading port but vertically below said loading port;
   a trolley sliding on said rail;
   a non-magnetic nacelle having a nacelle wall portion curved about said rail and accommodating said rail and said trolley within an interior said nacelle communicating with said interior of said vacuum load lock chamber;

a substrate paddle having a first substrate bearing surface and supported on said trolley with said first substrate bearing surface cantilevered from said trolley in said axial direction toward said loading port, wherein during an operation of said system said paddle is disposed at least partially beyond an axial end of said rail in a direction of said loading port from said load lock chamber;

a first magnet assembly carried on said trolley proximate said nacelle wall portion, magnetized in a first direction parallel to said axial direction, and having a curved shape on a side thereof facing said nacelle wall portion generally following a curvature of said curved nacelle wall portion; and a second magnet assembly magnetized in a direction opposite said first direction, translatable parallel to said axial direction, disposed on an opposite side of said nacelle wall portion from said first magnet assembly, having a shape on side thereof facing said nacelle wall portion generally following said curvature of the curved nacelle wall portion, magnetically coupled to said first magnet assembly, and adapted to cause said substrate paddle to deliver a substrate between said load lock chamber and said processing chamber.

13. The system of claim 12, wherein said nacelle wall portion includes a semi-circular surface disposed between said first and second magnet assembly.

14. The system of claim 12, wherein said first and second magnet assemblies include respective saddle-shaped magnets.

15. The system of claim 13, further comprising a mechanical drive exterior of said nacelle and said load lock chamber for translating said second magnet assembly parallel to said axial direction.

* * * * *